United States Patent
Qi et al.

(10) Patent No.: US 9,800,044 B2
(45) Date of Patent: Oct. 24, 2017

(54) FAULT LOCATION OF DC DISTRIBUTION SYSTEMS

(71) Applicant: ABB Technology Ltd., Zurich (CH)

(72) Inventors: Li Qi, Cary, NC (US); Xianyong Feng, Cary, NC (US); Jiuping Pan, Raleigh, NC (US)

(73) Assignee: ABB Schweiz AG, Baden (CH)

( * ) Notice: Subject to any disclaimer, the term of this patent is extended or adjusted under 35 U.S.C. 154(b) by 231 days.

(21) Appl. No.: 14/725,955

(22) Filed: May 29, 2015

(65) Prior Publication Data
US 2016/0352091 A1    Dec. 1, 2016

(51) Int. Cl.
| | |
|---|---|
| H02H 3/10 | (2006.01) |
| H02H 3/38 | (2006.01) |
| H02H 3/44 | (2006.01) |
| H02H 7/26 | (2006.01) |
| G01R 31/08 | (2006.01) |

(52) U.S. Cl.
CPC .............. *H02H 3/10* (2013.01); *H02H 3/38* (2013.01); *H02H 3/445* (2013.01); *H02H 7/268* (2013.01); *G01R 31/086* (2013.01); *G01R 31/088* (2013.01); *Y04S 10/522* (2013.01)

(58) Field of Classification Search
CPC ............ H02H 3/10; H02H 3/38; H02H 3/445; H02H 7/268; G01R 31/086; G01R 31/088
See application file for complete search history.

(56) References Cited

U.S. PATENT DOCUMENTS

| | | | | |
|---|---|---|---|---|
| 4,906,937 | A * | 3/1990 | Wikstrom | G01R 31/088 324/521 |
| 6,392,857 | B1 | 5/2002 | Leitloff et al. | |
| 8,941,387 | B2 | 1/2015 | Kim | |
| 2012/0200966 | A1* | 8/2012 | Hill | G01R 31/024 361/62 |
| 2013/0088802 | A1* | 4/2013 | Berggren | H02H 7/268 361/65 |
| 2013/0286521 | A1 | 10/2013 | Park | |

OTHER PUBLICATIONS

European Extended Search Report, EP Patent Appln. No. 16171583.4, dated Oct. 12, 2016, 7 pgs.

* cited by examiner

*Primary Examiner* — Scott Bauer
(74) *Attorney, Agent, or Firm* — Taft Stettinius & Hollister LLP

(57) ABSTRACT

Unique systems, methods, techniques and apparatuses of fault location in DC power distribution systems are disclosed. One exemplary embodiment is a DC power distribution system including a plurality of zones each including a DC power distribution line and a protective device. Each protective device structured to sense one or more electrical characteristics of a line and to controllably open a circuit including the line. At least one intelligent electronic device is structured to determine a line inductance based upon electrical characteristics sensed by one or more of the protective devices and to evaluate a location of the line fault based upon the determined line inductance.

31 Claims, 5 Drawing Sheets

FAULT LOCATION OF DC DISTRIBUTION SYSTEMS

BACKGROUND

The present disclosure relates generally to fault location in DC distribution systems, sometimes referred to as DC distribution networks. Recent improvement in energy and power density of power electronic switches has facilitated development of DC power distribution systems. Present efforts at fault location in DC power distribution systems suffer from a number of shortcomings and disadvantages. Existing proposals fail to effectively implement fault current limiting (FCL) functionality and to reduce the adverse impacts of high fault current on equipment within or coupled with the DC power distribution system and on the DC power distribution system itself. There remain unmet needs respecting identification of fault location, speed of fault protection, comprehensive coverage of protected system zones, reliability, minimization of communication delay, and local measurement of fault conditions and fault characteristics. Further unmet needs include enhancing protection selectivity, minimizing fault affected areas, accurate fault location, reducing equipment cost, reduction of fault currents, reducing post-fault over voltages, and fast fault protection. There is a significant need for the unique apparatuses, methods, systems and techniques disclosed herein.

DISCLOSURE

For the purposes of clearly, concisely and exactly describing non-limiting exemplary embodiments of the invention, the manner and process of making and using the same, and to enable the practice, making and use of the same, reference will now be made to certain exemplary embodiments, including those illustrated in the figures, and specific language will be used to describe the same. It shall nevertheless be understood that no limitation of the scope of the invention is thereby created, and that the invention includes and protects such alterations, modifications, and further applications of the exemplary embodiments as would occur to one skilled in the art with the benefit of the present disclosure.

SUMMARY

Exemplary embodiments include unique fault location systems, methods, techniques and apparatuses for DC power distribution systems. Further embodiments, forms, objects, features, advantages, aspects and benefits of the disclosure shall become apparent from the following description and drawings.

DETAILED DESCRIPTION OF ILLUSTRATIVE EMBODIMENTS

Figure 1:
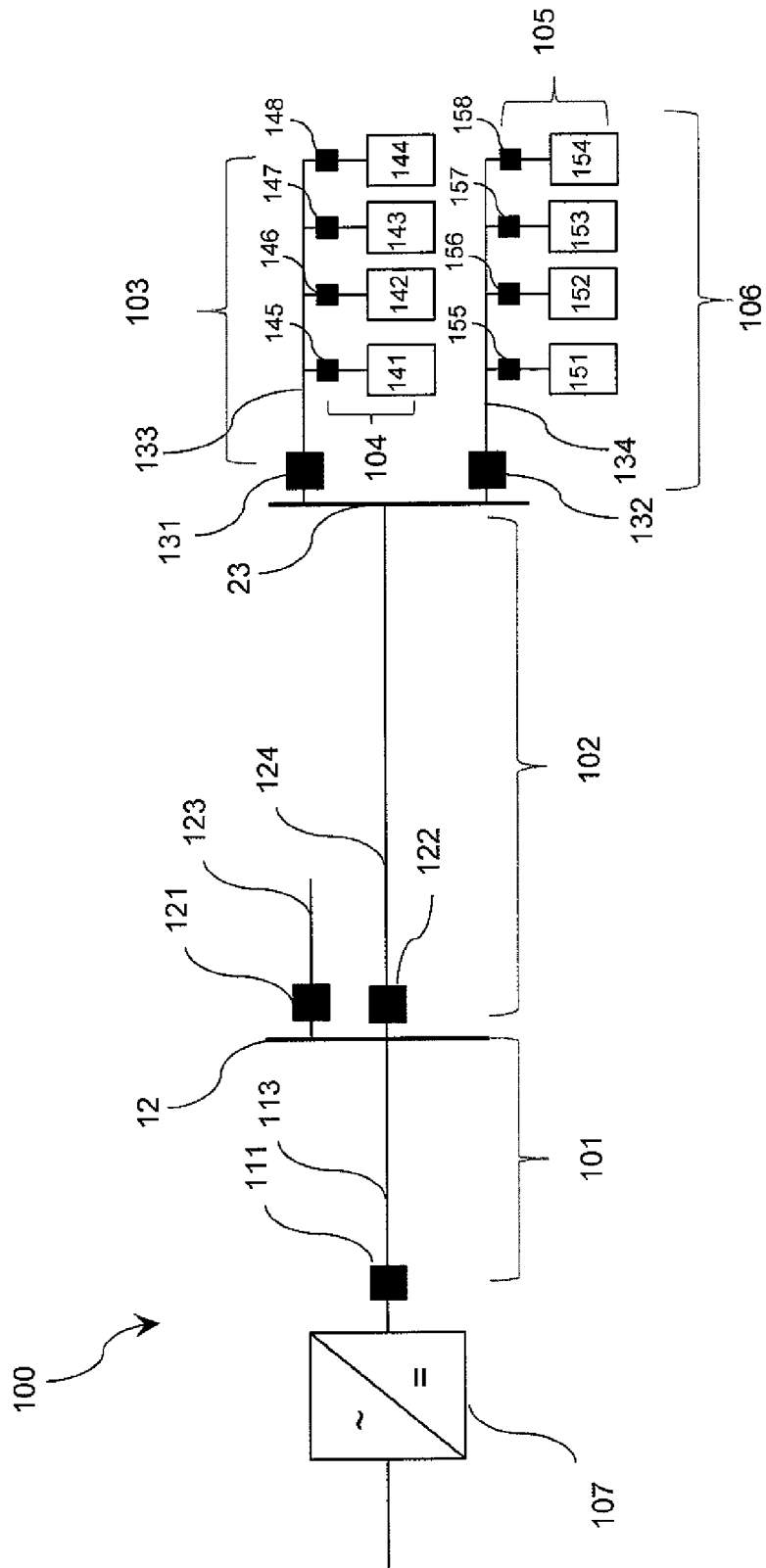
FIG. 1 illustrates an exemplary DC power distribution system.

With reference to FIG. 1 there is illustrated an exemplary DC power distribution system 100. In the illustrated embodiment, DC power distribution system 100 is structured as a converter-based, tightly-coupled DC power distribution system. In other embodiments, system 100 may be structured as another type of DC power distribution system. It shall be appreciated that system 100 may be implemented in a variety of applications, including power distribution systems in naval and marine vessels, land vehicles, construction equipment, mining equipment, aircraft, factories, manufacturing or other industrial facilities, data centers and server farms to name but a few examples.

DC power distribution system 100 includes AC/DC converter 107 which is structured to receive AC power from a transmission line or generation source (not illustrated), convert the AC power to DC power, and provide DC power to DC power distribution system 100. System 100 includes a plurality of protection zones 101, 102 and 103, and load zones 104 and 105. AC/DC converter 107 is operatively coupled to protection zone 101 which includes DC power distribution line 113 and local protective device 111 which is operatively coupled with distribution line 113.

In certain embodiments local protective device 111 includes a controllable circuit opening device such as a circuit breaker, relay, contactor or other device that can open and close a circuit including local protective device 111. In certain embodiments local protective device 111 includes devices or equipment which are structured to sense one or more electrical characteristics associated with distribution line 113 with which local protective device 111 is coupled, for example, current sensors and/or voltage sensors. In certain embodiments local protective device 111 includes one or more intelligent electronic devices such as a microcontroller-based control unit structured to receive and process information of electrical characteristics sensed by the sensor electronics of local protective device 111. In certain embodiments the intelligent electronic devices may be remote from local protection device 111 and/or may be operatively coupled with multiple local protective devices. In certain embodiments each local protective device 111 may include a dedicated associated intelligent electronic device. It shall be appreciated that any or all of the foregoing features may also be present in the other protective devices disclosed herein. In certain embodiments the one or more intelligent electronic devices may be capable of performing some or all of the calculations described below, receiving command signals and/or transmitting command signals.

Zone boundary 12 defines a boundary between protection zones 101 and 102. Protection zone 102 includes lines 123 and 124 which are coupled with local protective devices 121 and 122, respectively. Lines 123 and 124 are also coupled with one another, for example, via a common node or via a DC bus. It shall be appreciated that local protection devices 121 and 122 may include some or all of the structural and functional features described above in connection with local protective device 111.

Zone boundary 23 defines a boundary between protection zones 102 and 103. Protection zone 103 includes lines 133 and 134 which are operatively coupled with local protective devices 131 and 132, respectively. Lines 133 and 134 are also coupled with one another, for example, via a common node or via a DC bus. It shall be appreciated that local protection devices 131 and 132 may include some or all of the structural and functional features described above in connection with local protective device 111.

Protection zone 103 is coupled with load zone 104. Protection zone 106 is coupled with load zone 105. More specifically, line 133 is coupled with load zone 104 which includes loads 141-144 coupled with line 133 by way of local protective devices 145-148, respectively. Line 134 is operatively coupled with load zone 105 which includes loads 151-154 and local protective devices 155-158. Loads 151-154 are connected to line 134 by way of local protective devices 155-158, respectively. Each load 151-154, 141-144 may be fed by a DC/DC converter (not illustrated) or may be driven directly by the DC line or DC bus with which it is coupled.

In the illustrated embodiment, system 100 is a converter-based tightly coupled DC power distribution system. In another embodiment, system 100 may be structured as a variety of other types of DC power distribution systems.

Figure 2:
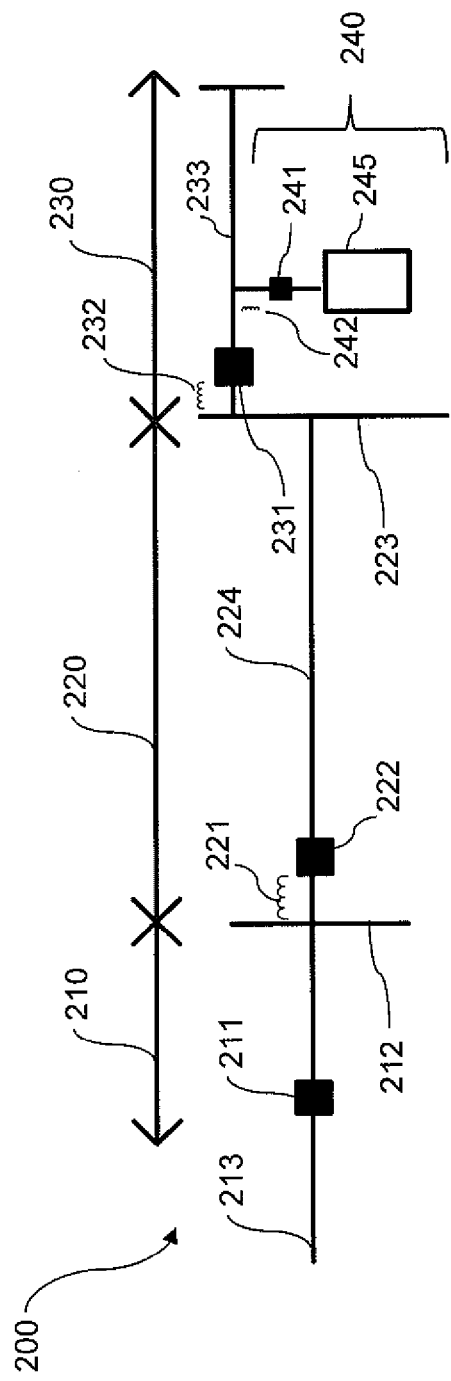
FIG. 2 illustrates another exemplary DC power distribution system.

With reference to FIG. 2 there is illustrated DC power distribution system 200. It shall be appreciated that system 200 and the features and components thereof may include any or all of the structural and functional features and attributes described above in connection with system 100. System 200 includes four zones 210, 220, 230 and 240. Zone 210 includes line 213 and local protective device 211 and is defined in part by zone boundary 212 which also defines in part adjacent zone 220. Local protective device 211 is operatively coupled to line 213 which may receive DC power from a DC power transmission system, an AC/DC converter, and/or a DC/DC converter, which may, in turn, be coupled with a power generation or transmission system as applicable. For clarity of illustration these features have not been depicted in FIG. 2, it being appreciated that a variety of configurations and combinations of these features are contemplated.

Zone 220 is bounded by zone boundaries 212 and 223. Zone 220 includes local protective device 222, line 224 and inductor 221 which is positioned in line with local protective device 222 and line 224. Local protective device 222 and inductor 221 are operatively coupled to line 224 in a series relationship in the illustrated embodiment, it being appreciated that other operative coupling relationships are also contemplated. It shall be further appreciated that other types of functionally equivalent inductance affecting devices may be utilized to adjust line inductance in accordance with the principles disclosed herein. It shall be further appreciated that such potential variations may also be utilized for the other inductors disclosed herein Zone 220 is operatively coupled with and adjacent to zones 210 and 230.

Zone 230 is bounded in part by zone boundary 223. Zone 230 includes local protective device 231, line 233 and inductor 232. Local protective device 231 and inductor 232 are operatively coupled to line 233 in a series relationship in the illustrated embodiment, it being appreciated that other operative coupling relationships are also contemplated.

Load zone 240 includes local protective device 241, inductor 242 and load 245. Load 245 is operatively coupled to line 233 of zone 230 by way of local protective device 241 and inductor 242. Local protective device 241 and inductor 242 are operatively coupled to line 233 in a series relationship in the illustrated embodiment, it being appreciated that other operative coupling relationships are also contemplated.

With continuing reference to FIG. 2, it shall be appreciated that inductors 221, 232, and 242 are provided at or proximate the boundaries separating zones 210, 220, 230 and 240. In certain preferred forms, placement of inductors is selected to be as close as possible to a zone boundary without adversely affecting the operation of local protective devices in adjacent zones. The zone boundary inductance are preferably large enough to overcome the neighboring protection zone overlapping caused by measurement errors as described in further detail herein. By way of example, if all estimated measurement errors contribute to ~10% error in calculated inductance, then the zone boundary inductance should be ~10% of inductance plus a margin of error. In certain embodiments, the zone boundary inductances are large enough to discriminate different distribution lines. It shall be further appreciated that in certain preferred forms the inductances of inductors 221, 232 and 242 are much smaller than system equivalent inductance such that they have little to no impact on noannual operation of system 200.

Figure 3:
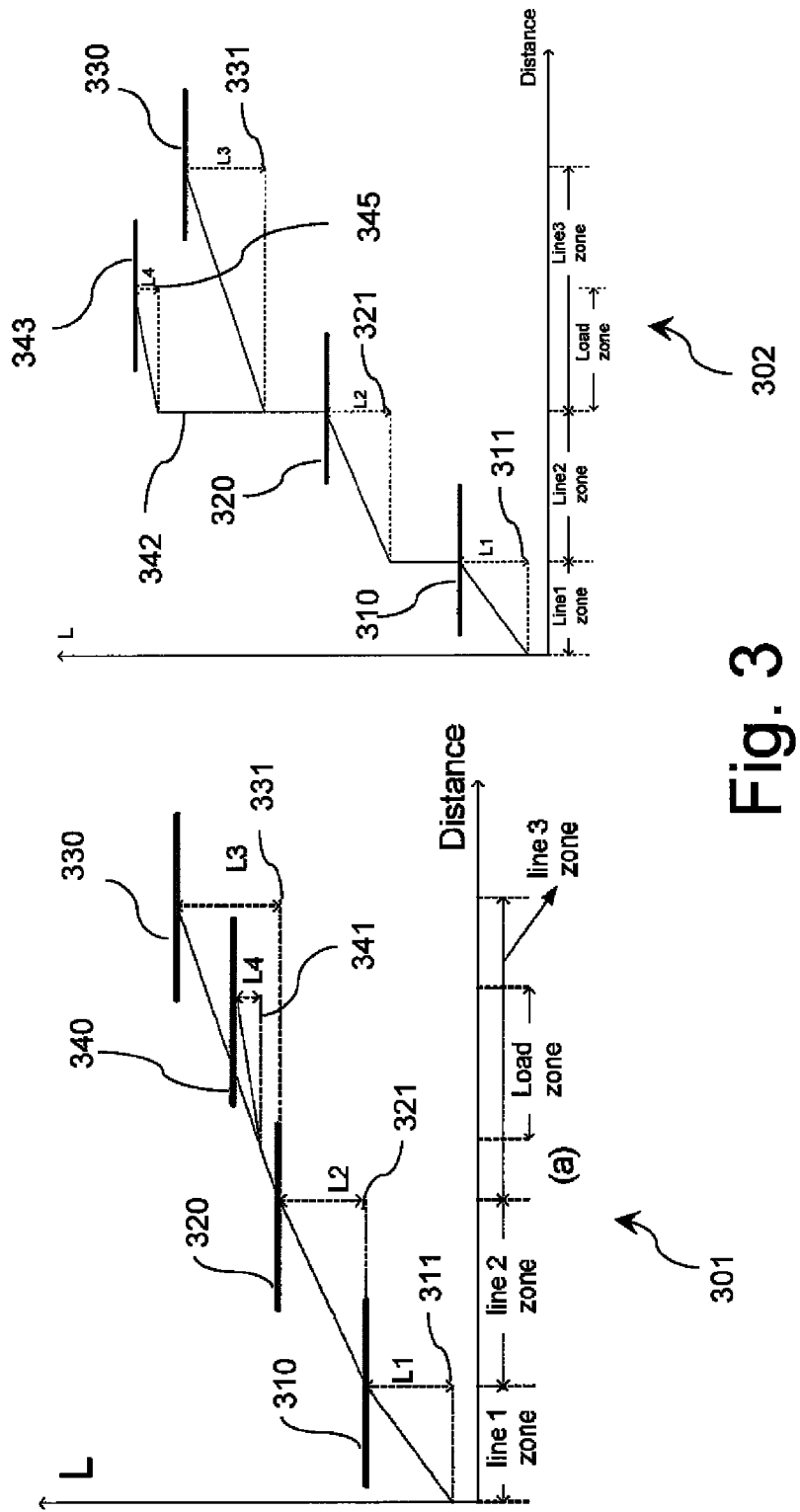
FIG. 3 illustrates graphs showing inductance values relative to distance in a DC power distribution system.

With reference to FIG. 3 there are illustrated graphs 301 and 302 which depict inductance values observable at the protective devices of system 200 during normal operation both before and after the addition of inductor 242 to zone 240. The inductance values include inductance 310 of zone 210; inductance 320 of zone 220; inductance 330 of zone 230; and inductance 340 of zone 240. Inductances 310, 320, 330 and 340 are representative of the inductances which can be determined by local protective devices 211, 222, 231 and 241, respectively, during normal, non-fault operation of system 200 when system 200 is on line.

Protective devices 211, 222, 231 and 241 are capable of protecting one or more protection zones. When a fault such as a line-to-line short circuit fault, line-to-ground fault or other type of fault occurs in system 200, the fault current limiting (FCL) function of one or more converters which may be coupled with system 200 can be initiated. Due to communication delay and inherent FCL control time constants, fault currents normally are uncontrolled for a certain time before limited to a fixed value. Transient voltages and currents during an uncontrolled period can be measured by local protective devices 211, 222, 231 and 241. The measured voltages and currents can be used to determine the inductance between a protective device and the fault location. If the derived inductance is less than already known line inductance for a given zone, then the fault is within the protected zone and the corresponding protective device will open to isolate the faulted part. The remaining portion of the DC power distribution system can continue normal operation. These operations can occur in advance of the time required to achieve the steady state current by the FCL function of a converter coupled with system 200. This allows for either redundant protection schemes, or elimination of the converter-based FCL functionality. With this inductance based fault location technique, fast and selective protection schemes of DC power distribution systems can be readily achieved.

In the circuit configuration associated with graph 302, the derived inductance values can be used to indicate the faults within most zones of system 200 even considering measurement errors. This can be accomplished because the fault inductances 311, 321 and 331 of zones 210, 220 and 230 (which are lower than the normal, non-fault inductances 310, 320 and 330) do not extend into adjacent zones or overlap. However, in the absence of inductors 221, 232, 242 this is not the case for zones 220, 230 and 240. Since there is overlap between the inductances of these zones due to measurement errors, it is not practicable to reliably differentiate between faults in the neighboring two zones. The addition of inductor 242 to zone 240 alleviates this overlap by providing an offset non-fault inductance 343 and an offset fault inductance 345 as illustrated graph 302. The amount of added inductance is denoted by offset inductance 342. Similar offset occurs for zone 220 and 230. After the added inductances, the location of faults in any of zones 210, 220, 230 and 240 can be uniquely distinguished. It shall be further appreciated that in certain embodiments, the insertion of inductors can be extended to each protection zone not only to differentiate faults between neighboring zones but also to increase fault location accuracy for the full range of a protected zone. It shall be appreciated that similar methodology may be utilized to select the parameters and locations of inductors or other impedance altering components for other protection zones of a DC power distribution system.

Figure 4:
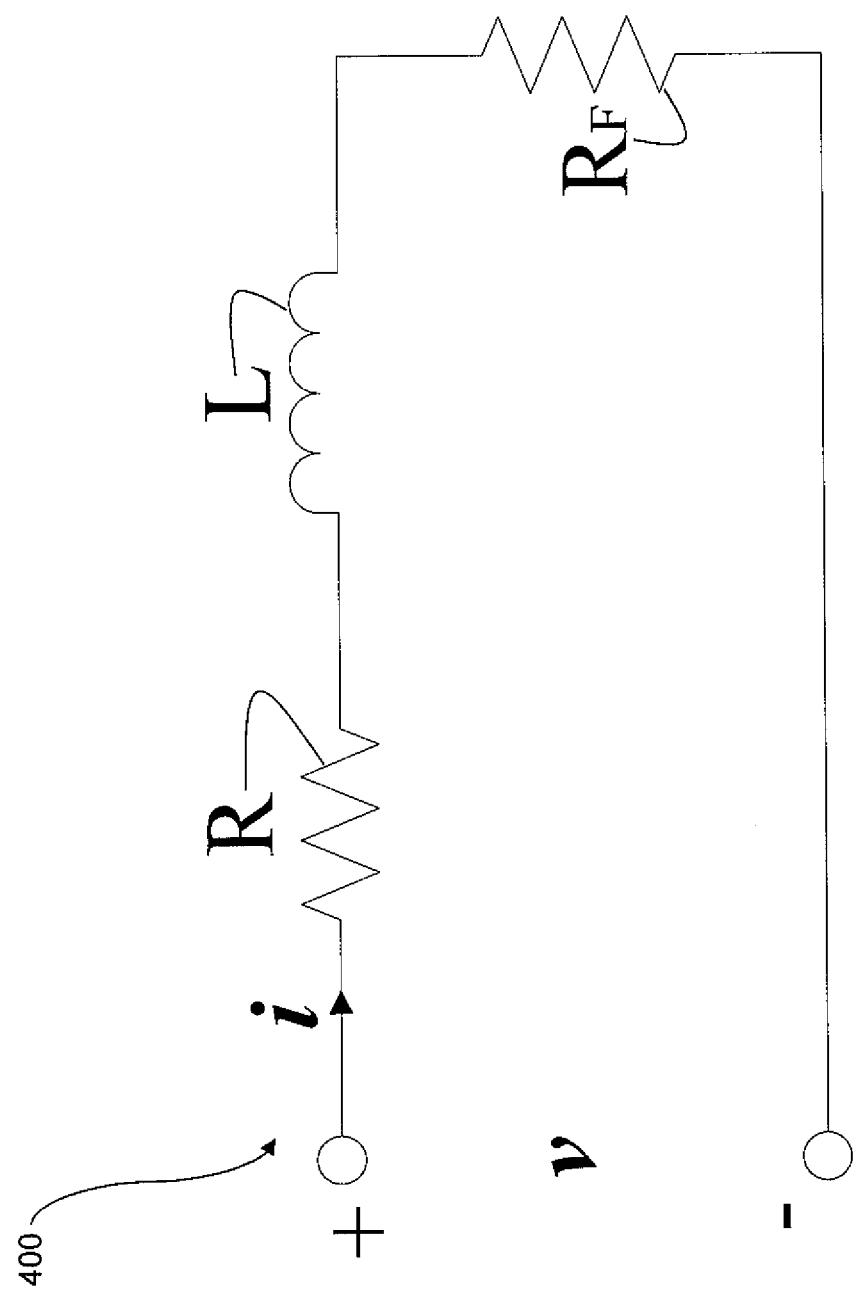
FIG. 4 illustrates an exemplary equivalent circuit between a protective device and a short circuit fault.

With reference to FIG. 4 there is illustrated equivalent circuit 400 representing a portion of system 100 or system 200 between a protective device and a short circuit fault. Equivalent circuit 400 includes line resistance R, line inductance L, and fault resistance $R_F$.

The state space equation of the equivalent circuit 400 can be expressed as:

$$v = L\frac{di}{dt} + (R + R_F)i \qquad \text{(Equation 1)}$$

The voltage, current and di/dt are sampled or calculated at different time steps. $(R+R_F)$ and L can be estimated from data sampled at multiple time instants, for example, using least squares method. The voltage at N sampling time instants can be expressed as:

$$v(0) = L\frac{di}{dt}(0) + (R + R_F)i(0) \qquad \text{(Equation 2)}$$
$$v(1) = L\frac{di}{dt}(1) + (R + R_F)i(1)$$
$$\vdots$$
$$v(N) = L\frac{di}{dt}(N) + (R + R_F)i(N)$$

where N is the sampling index, and the sampling rate could be chosen as low as possible according to Nyquist-Shannon Sampling Theorem.

Based on the least square method, the unknown parameters L and $R+R_F$ can be determined by $$B = \begin{bmatrix} v(0) \\ v(1) \\ \vdots \\ v(N) \end{bmatrix}, A = \begin{bmatrix} \frac{di}{dt}(0) & i(0) \\ \frac{di}{dt}(1) & i(1) \\ \vdots & \vdots \\ \frac{di}{dt}(N) & i(N) \end{bmatrix} \qquad \text{(Equation 3)}$$

$$\begin{bmatrix} L \\ R + R_F \end{bmatrix} = (A^T A)^{-1} A^T B \qquad \text{(Equation 4)}$$

At least two samples are preferred to identify parameters L and $R+R_F$. In certain embodiments, an online moving-window least square method is implemented to identify the equivalent inductance from the protective device to fault. The number of samples for the moving-window is defined by the user. It shall be appreciated that the one or more intelligent electronic devices disclosed herein may be configured to perform inductance calculations or determinations in accordance with the foregoing equations and techniques.

Figure 5:
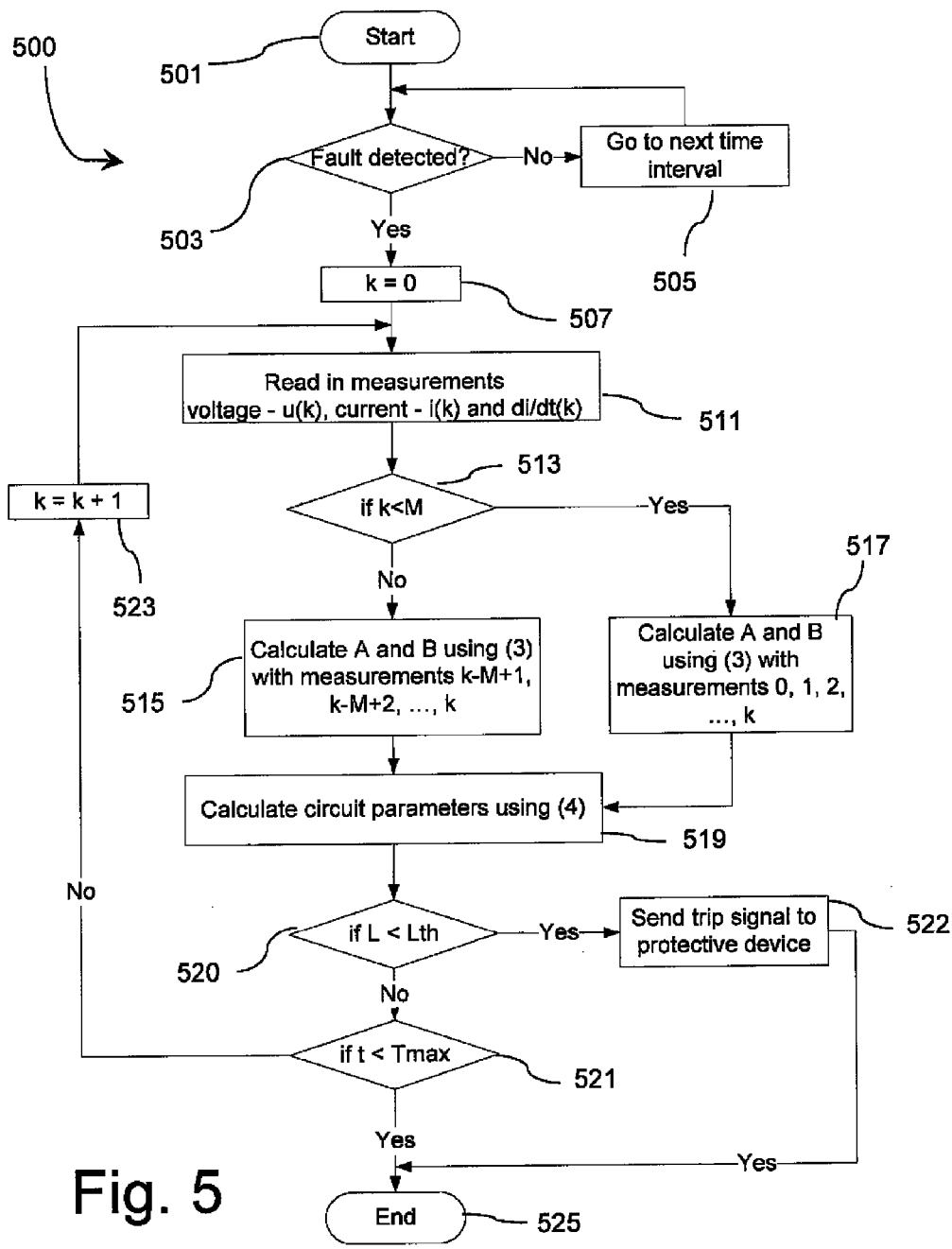
FIG. 5 illustrates an exemplary inductance determination process.

With reference to FIG. 5 there is illustrated an exemplary process 500 for calculating inductance values performed by an intelligent electronic device. Process 500 generally includes fault detection and fault location functionalities. Process 500 may be implemented in whole or in part in one or more of the intelligent electronic devices disclosed herein. In certain forms the fault detection and fault location functionalities may be performed by separate intelligent electronic devices. In certain forms both functionalities may be performed by the same intelligent electronic device. Furthermore, as noted above, the intelligent electronic devices disclosed herein may be dedicated to a respective local protective device or may be structured to serve multiple local protective devices.

Process 500 begins at start operation 501 and proceeds to conditional 503 which evaluates whether a fault is present. Conditional 503 may perform this evaluation using a variety of techniques such as a limit, threshold or trigger point established for line-to-line or line-to-ground voltage, line current or line current time rate of change. If a fault is not detected, process 500 proceeds to operation 505 which causes process 500 to proceed to the next time interval and then return to conditional 503. If conditional 503 detects a fault condition, process 500 proceeds to operation 507 where a counter value k is set to zero.

From operation 507, process 500 proceeds to operation 511 where an intelligent electronic device receives measurements of voltage, current, and di/dt which may be calculated by the intelligent electronic device based on line current measurement information or determined independently and provided to the intelligent electronic device.

From operation 511, process 500 proceeds to conditional 513 which evaluates whether counter value k is less than a user defined counter threshold M. If counter value k is less than a user defined value M, process 500 advances to operation 517 where matrices A and B from Equation 3 above are calculated or determined using all k samples. If counter value k is not less than user defined value M, the logic advances to operation 515 where matrices A and B from Equation 3 above are calculated or determined using the M most recent samples.

From either operation 515 or 517 process 500 proceeds to operation 519 where a line inductance L and optionally a sum of line resistance and fault resistance $R+R_F$ are calculated using Equation 4 above and matrices A and B. From operation 519, process 500 proceeds to conditional 520 where the calculated line inductance is compared to a normal, non-fault line inductance. If the calculated inductance is less than the non-fault line inductance, process 500 advances to the operation 522 to send a trip signal to open the protective device and then proceeds to end operation 525 which terminates the process 500. If the calculated inductance is larger than the non-fault line inductance, process 500 advances to conditional 521 where the time duration of the process 500 beginning at operation 511 is compared to a user defined value Tmax. If the time duration is less than Tmax, process 500 advances to operation 523 where the counter value k is incremented by one before the logic advances to operation 511. If the time duration is not less than Tmax, the logic advances to end operation 525 which may terminate process 500 allowing for it to be re-initiated at a later time.

As noted above, process 500 may be implemented in one or more intelligent electronic devices such as those disclosed herein. In certain embodiments a plurality of intelligent electronic devices each corresponding to a particular protection zone may execute process 500 at a separation location for each zone. In certain embodiments one or more central or clustered intelligent electronic devices may execute process 500 at one location for a plurality of protection zones. It shall be further appreciated that a number of variations and modifications to process 500 are contemplated including, for example, the omission of one or more aspects of process 500, the modification of the inductance calculation mathematics, the addition of further conditionals and operations and/or the reorganization or separation of operations and conditionals into separate processes.

A number of further exemplary embodiments shall now be described. One embodiment is a DC power distribution system comprising: a plurality of DC power distribution zones bounded by one or more zone boundaries, each of said zones including at least one DC power distribution line and at least one protective device operatively coupled with the DC power distribution line, each protective device structured to sense one or more electrical characteristics associated with the DC power distribution line with which it is operatively coupled and to controllably open a circuit including said DC power distribution line based upon detection and location of a line fault; at least one intelligent electronic device structured to determine one or more line inductance values based upon the one or more electrical characteristics sensed by one or more of the protective devices and to evaluate a location of the line fault based upon the determined line inductance values; and at least one inductor coupled with a DC distribution line of one of the plurality of zones, the inductor having an inductance value such that line inductances of each of the plurality of zones when no fault is present differ in magnitude such that the line inductance values determined by the at least one intelligent electronic device during a line fault uniquely identify one of the plurality of DC power distribution zones as containing the line fault.

In certain forms of the exemplary system the intelligent electronic device is structured to determine a line inductance using linear regression analysis based on a number of samples of the one or more electrical characteristics. In certain forms the number of samples used to determine line inductance is one of the total number of samples taken as of a first time interval following detection of the line fault and a predetermined number of most recent samples' as of a second time interval. In certain forms the one or more electrical characteristics comprise line-to-line or line-to-ground voltage, line current, and the first derivative of line current. In certain forms the line inductance is determined based upon a first matrix including a plurality of line-to-line or line-to-ground voltage values and a second matrix including a plurality of line current values and a plurality of first derivatives of line current values. Certain forms further comprise a plurality of intelligent electronic devices each associated with a respective protective device. In certain forms the DC power distribution system is a converter-based tightly-coupled DC power distribution system.

One exemplary embodiment is a method of locating faults in a DC power distribution network, the method comprising: defining a plurality of protection zones of the DC power distribution network; detecting a fault within the DC power distribution network; after detecting the fault sampling one or more electrical characteristics of each of the protection zones of the DC power distribution network; determining a plurality of line inductance values each associated with a respective protection zone; and locating the fault as being within one of the protection zones based upon the determined line inductance values.

In certain forms of the exemplary method the one or more electrical characteristics comprise voltage, current and current time rate of change. In certain forms the sampling of one or more electrical characteristics occurs while the DC power distribution network is online. In certain forms the locating the fault includes evaluating the determined line inductance values relative to corresponding predetermined inductance threshold values. In certain forms said predetermined inductance threshold values are based upon the inductance of respective protection zones under non-fault operating conditions plus a margin of error. In certain forms at least one protection zone includes an inductor having an inductance value selected such that line inductances of each of the plurality of zones when no fault is present differ in magnitude such that the line inductance values determined during a line fault uniquely identify a particular one of the plurality of DC power distribution zones as containing the fault. In certain forms the line inductance value is determined based upon a first matrix including a plurality of line-to-line or line-to-ground voltage sample values and a second matrix including a plurality of line current sample values and a plurality of first derivatives of line current sample values.

One exemplary embodiment is a method comprising: monitoring a plurality of protection zones of a DC power distribution system, the zones being demarcated by one or more boundaries; storing non-fault inductance values for each protection zone, the values reflective of inductance values during non-fault operation of the DC power distribution system detectable at a plurality of local protective devices each of which is associated with a respective protection zone; detecting a fault in the DC power distribution system; calculating a fault condition inductance value using information of one or more electrical characteristics sensed by one or more of the local protective devices; and determining which of the protection zones contains the fault based upon the calculated fault condition inductance value and the non-fault inductance values.

Certain forms of the exemplary method further comprise after the determining which of the protection zones contains the fault transmitting to the local protective device of the protection zone containing the fault a command to open a circuit including said local protective device. In certain forms the detecting the fault is based upon one or more of a current value exceeding a current threshold, a voltage value exceeding a voltage threshold, and a current time rate of change value exceeding a current time rate of change threshold. In certain foul's the calculating an inductance value is based upon a plurality of sensed voltage values, a plurality of sensed current values and a plurality of current time rate of change values. In certain forms the calculating an inductance value is based upon a linear regression utilizing the plurality of sensed voltage values, the plurality of sensed current values and the plurality of current time rate of change values. In certain forms each of the local protective devices includes intelligent electronics which calculate the inductance of its respective protection zone.

While the invention has been illustrated and described in detail in the drawings and foregoing description, the same is to be considered as illustrative and not restrictive in character, it being understood that only certain exemplary embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

The invention claimed is:

1. A DC power distribution system comprising:
a plurality of DC power distribution zones bounded by one or more zone boundaries, each of said zones including at least one DC power distribution line and at least one protective device operatively coupled with the DC power distribution line, each protective device structured to sense one or more electrical characteristics associated with the DC power distribution line with which it is operatively coupled and to controllably open a circuit including said DC power distribution line based upon detection and location of a line fault;
at least one intelligent electronic device structured to determine one or more line inductance values based upon the one or more electrical characteristics sensed by one or more of the protective devices and to evaluate a location of the line fault based upon the determined line inductance values; and
at least one inductor coupled with a DC distribution line of one of the plurality of zones, the inductor having an inductance value such that line inductances of each of the plurality of zones when no fault is present differ in magnitude such that the line inductance values determined by the at least one intelligent electronic device during a line fault uniquely identify one of the plurality of DC power distribution zones as containing the line fault.

2. The system of claim 1 wherein the intelligent electronic device is structured to determine a line inductance using linear regression analysis based on a number of samples of the one or more electrical characteristics.

3. The system of claim 2 wherein the number of samples used to determine line inductance is one of the total number of samples taken as of a first time interval following detection of the line fault and a predetermined number of most recent samples as of a second time interval.

4. The system of claim 1 wherein the one or more electrical characteristics comprise line-to-line or line-to-ground voltage, line current, and the first derivative of line current.

5. The system of claim 4 wherein the line inductance is determined based upon a first matrix including a plurality of line-to-line or line-to-ground voltage values and a second matrix including a plurality of line current values and a plurality of first derivatives of line current values.

6. The system of claim 1 comprising a plurality of intelligent electronic devices each associated with a respective protective device.

7. The system of claim 1 wherein the DC power distribution system is a converter-based tightly-coupled DC power distribution system.

8. A method of locating faults in a DC power distribution network, the method comprising:
defining a plurality of protection zones of the DC power distribution network, at least one of the protection zones including an inductor;
detecting a fault within the DC power distribution network;
after detecting the fault sampling one or more electrical characteristics of each of the protection zones of the DC power distribution network;
determining a plurality of line inductance values each associated with a respective protection zone; and
locating the fault as being within one of the protection zones based upon the determined line inductance values,
wherein the line inductor is sized such that the line inductance values determined during the fault uniquely identifies a fault location within one of the plurality of protection zones.

9. The method of claim 8 wherein the one or more electrical characteristics comprise voltage, current and current time rate of change.

10. The method of claim 8 wherein the sampling of one or more electrical characteristics occurs while the DC power distribution network is online.

11. The method of claim 8 wherein the locating the fault includes evaluating the determined line inductance values relative to corresponding predetermined inductance threshold values.

12. The method of claim 11 wherein said predetermined inductance threshold values are based upon the inductance of respective protection zones under non-fault operating conditions plus a margin of error.

13. The method of claim 8 wherein at least one protection zone includes an inductor having an inductance value selected such that line inductances of each of the plurality of zones when no fault is present differ in magnitude such that the line inductance values determined during a line fault uniquely identify a particular one of the plurality of DC power distribution zones as containing the fault.

14. The method of claim 8 wherein the line inductance value is determined based upon a first matrix including a plurality of line-to-line or line-to-ground voltage sample values and a second matrix including a plurality of line current sample values and a plurality of first derivatives of line current sample values.

15. A method comprising:
monitoring a plurality of protection zones of a DC power distribution system, the zones being demarcated by one or more boundaries and at least one zone including an inductor;
storing non-fault inductance values for each protection zone, the values reflective of inductance values during non-fault operation of the DC power distribution system detectable at a plurality of local protective devices each of which is associated with a respective protection zone;
detecting a fault in the DC power distribution system;
calculating a fault condition inductance value using information of one or more electrical characteristics sensed by one or more of the local protective devices; and
determining which of the protection zones contains the fault based upon the calculated fault condition inductance value and the non-fault inductance values,
wherein the inductor is sized such that the fault condition inductance value determined during the fault uniquely identifies one of the plurality of protection zones as containing the fault.

16. The method of claim 15 further comprising after the determining which of the protection zones contains the fault transmitting to the local protective device of the protection zone containing the fault a command to open a circuit including said local protective device.

17. The method of claim 15 wherein the detecting the fault is based upon one or more of a current value exceeding a current threshold, a voltage value exceeding a voltage threshold, and a current time rate of change value exceeding a current time rate of change threshold.

18. The method of claim 15 wherein the calculating an inductance value is based upon a plurality of sensed voltage values, a plurality of sensed current values and a plurality of current time rate of change values.

19. The method of claim 18 wherein the calculating an inductance value is based upon a linear regression utilizing the plurality of sensed voltage values, the plurality of sensed current values and the plurality of current time rate of change values.

20. The method of claim 15 wherein each of the local protective devices includes intelligent electronics which calculate the inductance of its respective protection zone.

21. A DC power distribution system comprising:
a plurality of DC power distribution zones bounded by one or more zone boundaries, each of said zones including at least one DC power distribution line and at least one protective device operatively coupled with the DC power distribution line, each protective device structured to sense one or more electrical characteristics associated with the DC power distribution line with which it is operatively coupled and to controllably open a circuit including said DC power distribution line based upon detection and location of a line fault;
at least one intelligent electronic device structured to determine one or more line inductance values based upon the one or more electrical characteristics sensed by one or more of the protective devices and to evaluate a location of the line fault based upon the determined line inductance values; and
at least one inductor coupled with a DC distribution line of one of the plurality of zones, the inductor having an inductance value such that line inductances of each of the plurality of zones when no fault is present differ in magnitude such that the line inductance values determined by the at least one intelligent electronic device during a line fault uniquely identify one of the plurality of DC power distribution zones as containing the line fault,
wherein the line inductance is calculated using an equation including a first matrix derived from a set of line-to-line or line-to-ground voltage values, and a second matrix derived from a set of line current values and a set of first derivatives of line current values.

22. The system of claim 21 wherein the intelligent electronic device is structured to determine a line inductance using linear regression analysis based on a number of samples of the one or more electrical characteristics.

23. The system of claim 22 wherein the number of samples used to determine line inductance is one of the total number of samples taken as of a first time interval following detection of the line fault and a predetermined number of most recent samples as of a second time interval.

24. The system of claim 21 comprising a plurality of intelligent electronic devices each associated with a respective protective device.

25. The system of claim 21 wherein the DC power distribution system is a converter-based tightly-coupled DC power distribution system.

26. A method of locating faults in a DC power distribution network, the method comprising:
defining a plurality of protection zones of the DC power distribution network;
detecting a fault within the DC power distribution network;
after detecting the fault sampling one or more electrical characteristics of each of the protection zones of the DC power distribution network;
determining a plurality of line inductance values each associated with a respective protection zone using an equation including a first matrix derived from a set of line-to-line or line-to-ground voltage values, and a second matrix derived from a set of line current values and a set of first derivatives of line current values; and
locating the fault as being within one of the protection zones based upon the determined line inductance values.

27. The method of claim 26 wherein the one or more electrical characteristics comprise voltage, current and current time rate of change.

28. The method of claim 26 wherein the sampling of one or more electrical characteristics occurs while the DC power distribution network is online.

29. The method of claim 26 wherein the locating the fault includes evaluating the determined line inductance values relative to corresponding predetermined inductance threshold values.

30. The method of claim 29 wherein said predetermined inductance threshold values are based upon the inductance of respective protection zones under non-fault operating conditions plus a margin of error.

31. The method of claim 26 wherein at least one protection zone includes an inductor having an inductance value selected such that line inductances of each of the plurality of zones when no fault is present differ in magnitude such that the line inductance values determined during a line fault uniquely identify a particular one of the plurality of DC power distribution zones as containing the fault.

* * * * *